United States Patent [19]
McDonnell et al.

[11] Patent Number: 5,973,628
[45] Date of Patent: Oct. 26, 1999

[54] PARALLEL VARIABLE BIT ENCODER

[75] Inventors: Michael McDonnell; Hojjat Salemi, both of Nepean, Canada

[73] Assignee: Cisco Technology, Inc., San Jose, Calif.

[21] Appl. No.: 08/943,527

[22] Filed: Oct. 3, 1997

[51] Int. Cl.[6] .................................................. H03M 7/40
[52] U.S. Cl. ............................................. 341/67; 370/465
[58] Field of Search ................................. 341/50, 67, 60; 370/465, 505

[56] References Cited

U.S. PATENT DOCUMENTS

| | | | |
|---|---|---|---|
| 5,268,935 | 12/1993 | Mediavilla et al. | 375/118 |
| 5,272,703 | 12/1993 | Peters | 370/102 |
| 5,327,126 | 7/1994 | Beanland | 341/118 |
| 5,337,334 | 8/1994 | Molloy | 375/118 |
| 5,461,380 | 10/1995 | Peters et al. | 341/100 |
| 5,548,534 | 8/1996 | Upp | 364/514 R |

*Primary Examiner*—Brian Young
*Assistant Examiner*—Peguy JeanPierre

[57] ABSTRACT

A data segmentation circuit is disclosed for use in DS3/STS-1 mapping. The data segmentation circuit uses a circular data buffer to store data for mapping. A recirculating barrel shifter is used for extracting data from within the buffer. A counter moves the barrel shifter window zero, one, five, or eight bits to align the barrel shifter output as necessary to extract a next datum for a next payload envelope location. Data stuffing is then performed. Control circuitry for providing throttling and bit stuffing as required in an STS-1 information payload is disclosed.

14 Claims, 14 Drawing Sheets

| SIGNAL NAME | I/O | DESCRIPTION |
|---|---|---|
| TOD | INPUT | LOW SPEED DSS OVERHEAD COMMUNICATIONS CHANNEL TO BE INSERTED INTO THE "O" BITS OF THE SPE. TOD IS ALIGNED WITH THE *FALLING* EDGE OF TOCK. |
| CBIA_DS3DMB | INPUT | DS3 MODE(1) OF DATA MODE (0)CONTROL |
| CBIA_AISGEN | INPUT | DS3 AIS ENABLED(1) OR DISABLED(0). |
| CBIA_RBSO | INPUT | STUFF BITS SET TO "1"(1) OR STUFF BITS SET TO "0"(0). |
| ESA_RDATA[7:0] | INPUT | DATA FROM THE ELASTIC STORE. |
| AISA_AIS[7:0] | INPUT | AIS SIGNAL. |
| TBIA_GCK | INPUT | SONET BYTE CLOCK: 6.48 MHz. |
| CBIA_RSTB | INPUT | ACTIVE LOW RESET. THIS SIGNAL ENTERS THE RCOI BLOCK ASYNCHRONOUSLY BUT IS *CLOCKED* INTO ALL THE FLIP FLOPS. THUS THE RESET OF THE RCOI BLOCK IS SYNCHRONOUS TO TBIA_GCK. |
| MONA_SPEED_UP | INPUT | "SPEED UP THE DS3 STUFFING RATE" CONTROL SIGNAL. |
| MONA_SLOW_DWN | INPUT | "SLOW DOWN THE DS3 STUFFING RATE" CONTROL SIGNAL. |
| TBIA_POH | INPUT | PATH OVERHEAD TIMING STROBE. |
| TBIA_TOH | INPUT | TRANSPORT OVERHEAD TIMING STROBE. |
| TBIA_FS_COL | INPUT | FIXED STUFF BYTE COLUMN OF THE SPE. TIMING STROBE. |
| TBIA_INFO_COL | INPUT | INFO BYTE COLUMN OF THE SPE. TIMING STROBE. |
| TBIA_COL3 | INPUT | COLUMN 3 OF THE SPE. TIMING STROBE. |
| TBIA_COL31 | INPUT | COLUMN 31 OF THE SPE. TIMING STROBE. |
| TBIA_COL44 | INPUT | COLUMN 44 OF THE SPE. TIMING STROBE. |
| TBIA_COL60 | INPUT | COLUMN 60 OF THE SPE. TIMING STROBE. |
| TBIA_OCK | INPUT | DS3 OVERHEAD COMMUNICATIONS CHANNEL CLOCK, NOMINALLY 144 KHz. |
| TBIA_ROW0 | INPUT | IDENTIFIES SPE ROW 0 WITHIN A 3-ROW CYCLE. |
| TBIA_ROW1 | INPUT | IDENTIFIES SPE ROW 1 WITHIN A 3-ROW CYCLE. |
| TBIA_ROW2 | INPUT | IDENTIFIES SPE ROW 2 WITHIN A 3-ROW CYCLE. |
| TOCK | OUTPUT | DS3 OVERHEAD COMMUNICATIONS CHANNEL CLOCK. THIS IS A BUFFERED VERSION OF TBIA_OCK WHICH IS SHIPPED OUT OF THE TSB. |
| RCOI_STS[7:0] | OUTPUT | ASSEMBLED STS-1 SIGNAL (WITH OVERHEAD BYTES SET TO ZERO). |
| RCOI_READ | OUTPUT | INCREMENT THE READ POINTER OF THE MONA BLOCK SO THAT A NEW DATA BYTE CAN BE READ OUT OF THE ELASTIC STORE OR ENABLE THE AIS GENERATOR SO THAT IT OUTPUTS A NEW AIS BYTE. |

*Fig. 3a*

| BIT STUFFING RATE | CONTROL SIGNAL VALUE | | | DISTRIBUTION OF USED STUFF OPPORTUNITIES IN THE SPE | | | | | | | | |
|---|---|---|---|---|---|---|---|---|---|---|---|---|
| | CIBA_AISGEN | MONA_SPEED_CP | MONA_SLOW_DWS | ROW 0 | ROW 1 | ROW 2 | ROW 3 | ROW 4 | ROW 5 | ROW 6 | ROW 7 | ROW 8 |
| SLOW | 0 | 0 | 1 | | | | | | | | | |
| NOMINAL | 0 | 0 | 0 | | | | | | | | | |
| | 1 | X | X | | | | | | | | | |
| FAST | 0 | 1 | 0 | | | | | | | | | |

Fig. 3b

| TBIA_GCK | 1 | 2 | 3 | 4 | 5 | 6 | 7 | 8 | 9 | 10 | 11 | 12 | 13 | 14 |
|---|---|---|---|---|---|---|---|---|---|---|---|---|---|---|
| INFO[7] | X | ■ | ■ | ■ | X | ■ | ■ | ■ | X | ■ | ■ | ■ | X | ■ |
| INFO[6] | X | ■ | ■ | ■ | X | ■ | ■ | ■ | X | ■ | ■ | ■ | X | ■ |
| INFO[5] | X | ■ | ■ | ■ | X | ■ | ■ | ■ | X | ■ | ■ | ■ | X | ■ |
| INFO[4] | ■ | ■ | ■ | ■ | X | ■ | ■ | ■ | ■ | ■ | ■ | ■ | X | ■ |
| INFO[3] | ■ | ■ | ■ | ■ | X | ■ | ■ | ■ | ■ | ■ | ■ | ■ | X | ■ |
| INFO[2] | ■ | ■ | ■ | ■ | X | ■ | ■ | ■ | ■ | ■ | ■ | ■ | X | ■ |
| INFO[1] | ■ | ■ | ■ | ■ | X | ■ | ■ | ■ | ■ | ■ | ■ | ■ | X | ■ |
| INFO[0] | ■ | ■ | ■ | ■ | ■ | ■ | ■ | ■ | ■ | ■ | ■ | ■ | ■ | ■ |

*Fig. 5a*

| | 1 | 2 | 3 | 4 | 5 | 6 | 7 | 8 | 9 | 10 | 11 | 12 | 13 | 14 |
|---|---|---|---|---|---|---|---|---|---|---|---|---|---|---|
| TBIA_GCK | ⎍⎍⎍⎍⎍⎍⎍⎍⎍⎍⎍⎍⎍⎍ |||||||||||||
| REG1[7] | X | ■ | 9 | ■ | 25 | 25 | ■ | 41 | ■ | 57 | ■ | 73 | 73 | ■ |
| REG1[6] | X | ■ | 10 | ■ | 26 | 26 | ■ | 42 | ■ | 58 | ■ | 74 | 74 | ■ |
| REG1[5] | X | ■ | 11 | ■ | 27 | 27 | ■ | 43 | ■ | 59 | ■ | 75 | 75 | ■ |
| REG1[4] | X | ■ | 12 | ■ | 28 | 28 | ■ | 44 | 60 | ■ | 76 | ■ | 76 | ■ |
| REG1[3] | X | ■ | 13 | ■ | 29 | 29 | ■ | 45 | 61 | ■ | 77 | ■ | 77 | 93 |
| REG1[2] | X | 14 | ■ | 30 | ■ | 30 | ■ | 46 | 62 | ■ | 78 | ■ | 78 | 94 |
| REG1[1] | X | 15 | ■ | 31 | 31 | ■ | 47 | ■ | 63 | ■ | 79 | ■ | 79 | 95 |
| REG1[0] | X | 16 | ■ | 32 | 32 | ■ | 48 | ■ | 64 | ■ | 80 | ■ | 80 | 96 |
| REG0[7] | ■ | 1 | ■ | 17 | 17 | ■ | 33 | ■ | 49 | ■ | 65 | ■ | 81 | 81 |
| REG0[6] | ■ | 2 | ■ | 18 | 18 | ■ | 34 | ■ | 50 | ■ | 66 | ■ | 82 | 82 |
| REG0[5] | ■ | 3 | ■ | 19 | 18 | ■ | 35 | ■ | 51 | ■ | 67 | ■ | 83 | 83 |
| REG0[4] | ■ | 4 | ■ | 20 | 20 | ■ | 36 | ■ | 52 | 88 | ■ | 84 | ■ | 84 |
| REG0[3] | ■ | 5 | ■ | 21 | 21 | ■ | 37 | ■ | 53 | 69 | ■ | 85 | 85 | ■ |
| REG0[2] | 6 | ■ | 23 | ■ | 22 | ■ | 38 | ■ | 64 | 70 | ■ | 86 | 88 | ■ |
| REG0[1] | 7 | ■ | 23 | ■ | 23 | 39 | ■ | 55 | ■ | 71 | ■ | 87 | 87 | ■ |
| REG0[0] | 8 | ■ | 24 | ■ | 24 | 40 | ■ | 56 | ■ | 72 | ■ | 88 | 88 | ■ |

| | 1 | 2 | 3 | 4 | 5 | 6 | 7 | 8 | 9 | 10 | 11 | 12 | 13 | 14 |
|---|---|---|---|---|---|---|---|---|---|---|---|---|---|---|
| TBIA_GCK | ⎍⎍⎍⎍⎍⎍⎍⎍⎍⎍⎍⎍⎍⎍ |||||||||||||
| INCR_BY_1 | | | | | | ⎍ | | | | | | | ⎍ | |
| INCR_BY_5 | ⎍ | | | | | | | ⎍ | | | | | | |
| INCR_BY_8 | | ⎍ | | | ⎍ | | | | | ⎍ | | | | ⎍ |
| THE SHIFT AMOUNT, q[3:0] | 5 | 13 | 5 | 13 | 14 | 6 | 14 | 6 | 11 | 3 | 11 | 3 | 4 | 12 |
| COUNT>8 | | | | | | | | | | | | | | |
| REG1_LOAD | | | | | | | | | | | | | | |
| REG0_LOAD | | | | | | | | | | | | | | |
| RCOI_READ | | | | | | | | | | | | | | |

*Fig. 5b*

| RCOI_SISI[7:0] BIT NUMBER | RCOI_STS[7:0] BIT VALUE | WHEN? |
|---|---|---|
| 0 | "0" | TBIA_POH-1 OR TDIA_TOH=1 |
|   | R = "0" | {TBIA_FS_COL=1 & CBIA_RBOS=0} OR {TBIA_COL31=] & CBIA_RBOS=0} |
|   | R = "1" | {TBIA_FS_COL=1 & CBIA_RBOS=1} OR {TBIA_COL31=1 & CBIA_RBOS=1} |
|   | I = INFO[0] | TBIA_INFO_COL=1 OR TBIA_COL3=1 |
|   | S = "0" | TBIA_COL60=1 & STUFF_ENABLE=0 |
|   | S = I = INFO[0] | TBIA_COL60=1 & STUFF_ENABLE=1 |
| 1 | "0" | TBIA_POH=1 OR TBIA_TOH=1 |
|   | R = "0" | {TBIA_FS_COL=1 & CBIA_RBOS=0} OR {TBIA_COL31=1 & CBIA_RBOS=0} OR {TBIA_COL60=1 & CBIA_RBOS=0} |
|   | R = "1" | {TBIA_FS_COL=1 & CBIA_RBOS=1} OR {TBIA_COL31=1} & CBIA_RBOS=1} OR {TBIA_COL60=1 & CBIA_RBOS=1} |
|   | 1 = INFO[1] | TBIA_INFO_COL=1 OR TBIA_COL3=1 |

*Fig.11*

PARALLEL VARIABLE BIT ENCODER

FIELD OF THE INVENTION

The invention relates generally to encoding and decoding of digital data and more particularly to a method of segmenting data using a barrel shifter, the data for transmission using an STS-1 protocol.

BACKGROUND OF THE INVENTION

Barrel shifters are known electronic circuits. A barrel shifter comprises a buffer and a means for providing a movable window at an output thereof. In a recirculating barrel shifter, the buffer is circular and when the window keeps moving around the circular buffer—its start location incremented between cycles.

Barrel shifters are used for data decompression when variable bit compression schemes are used. Barrel shifters are also used in arithmetic function implementations, circular buffer circuits, parallel processing, control systems, and so forth. The use of barrel shifters in different applications has been included in patent applications since at least as early as Feb. 22, 1982. The use of barrel shifter circuits for encoding and decoding as described in some of the patents below, applies to compression and decompression algorithms where a plurality of bits is compressed into a smaller number of bits and look up tables are necessary to determine a shift amount for each processing cycle.

Examples of U.S. Patents describing circuits or systems using barrel shifters include U.S. Pat. No. 5,650,781 entitled Apparatus for decoding variable length codes; U.S. Pat. No. 5,646,874 entitled Multiplication/multiplication-accumulation method and computing device; U.S. Pat. No. 5,646,873 entitled Barrel shifter device and variable-length decoder; U.S. Pat. No. 5,642,115 entitled Variable length coding system; U.S. Pat. No. 5,634,065 entitled Three input arithmetic logic unit with controllable shifter and mask generator; U.S. Pat. No. 5,621,405 entitled Variable-length decoding apparatus using relative address; U.S. Pat. No. 5,619,200 entitled Code table reduction apparatus for variable length decoder; U.S. Pat. No. 5,619,198 entitled Number format conversion apparatus for signal processing; U.S. Pat. No. 5,604,499 entitled Variable-length decoding apparatus; U.S. Pat. No. 5,600,847 entitled Three input arithmetic logic unit with mask generator; U.S. Pat. No. 5,594,927 entitled Apparatus and method for aligning data transferred via DMA using a barrel shifter and a buffer comprising of byte-wide, individually addressabe FIFO circuits; U.S. Pat. No. 5,590,350 entitled Three input arithmetic logic unit with mask generator; U.S. Pat. No. 5,561,690 entitled High speed variable length code decoding apparatus; U.S. Pat. No. 5,557,734 entitled Cache burst architecture for parallel processing, such as for image processing; U.S. Pat. No. 5,557,563 entitled Data processing method and apparatus including iterative multiplier; U.S. Pat. No. 5,555,202 entitled Low-power, high-performance barrel shifter; U.S. Pat. No. 5,553,010 entitled Data shifting circuit capable of an original data width rotation and a double data width rotation; U.S. Pat. No. 5,542,074 entitled Parallel processor system with highly flexible local control capability, including selective inversion of instruction signal and control of bit shift amount; U.S. Pat. No. 5,532,949 entitled Barrel shifter; U.S. Pat. No. 5,529,071 entitled Increasing dynamic range with a barrel shifter; U.S. Pat. No. 5,526,296 entitled Bit field operating system and method with two barrel shifters for high speed operations; U.S. Pat. No. 5,517,436 entitled Digital signal processor for audio applications; U.S. Pat. No. 5,509,129 entitled Long instruction word controlling plural independent processor operations; U.S. Pat. No. 5,499,382 entitled Circuit and method of bit-packing and bit-unpacking using a barrel shifter; U.S. Pat. No. 5,481,583 entitled Higher order preinterpolator for backprojection; U.S. Pat. No. 5,479,527 entitled Variable length coding system; U.S. Pat. No. 5,477,477 entitled Data shifting circuit by utilizing MOS barrel shifter; U.S. Pat. No. 5,471,628 entitled Multi-function permutation switch for rotating and manipulating an order of bits of an input data byte in either cyclic or non-cyclic mode; U.S. Pat. No. 5,465,223 entitled Barrel shifter; U.S. Pat. No. 5,465,222 entitled Barrel shifter or multiply/divide IC structure; U.S. Pat. No. 5,463,638 entitled Control device for interface control between a test machine and multi-channel electronic circuitry, in particular according to boundary test standard; U.S. Pat. No. 5,457,723 entitled Barrel shifter having CMOS structure integrated on MOS integrated circuits; U.S. Pat. No. 5,450,607 entitled Unified floating point and integer datapath for a RISC processor; U.S. Pat. No. 5,432,512 entitled Apparatus for decoding variable length codes; U.S. Pat. No. 5,420,584 entitled Data converter with barrel shifter; U.S. Pat. No. 5,416,731 entitled Highspeed barrel shifter; U.S. Pat. No. 5,404,138 entitled Apparatus for decoding variable length codes; U.S. Pat. No. 5,343,195 entitled Variable length codeword decoding apparatus; U.S. Pat. No. 5,381,454 entitled Circuit and method of resetting a data compressor/decompressor; U.S. Pat. No. 5,309,156 entitled Variable-length code decoding device; U.S. Pat. No. 5,295,250 entitled Microprocessor having barrel shifter and direct path for directly rewriting output data of barrel shifter to its input; U.S. Pat. No. 5,282,152 entitled Integer-based 18-bit RGB to 5-bit gray scale conversion device and method therefor; U.S. Pat. No. 5,262,971 entitled Bidirectional shifter; U.S. Pat. No. 5,247,627 entitled Digital signal processor with conditional branch decision unit and storage of conditional branch decision results; U.S. Pat. No. 5,245,637 entitled Phase and frequency adjustable digital phase lock logic system; U.S. Pat. No. 5,245,338 entitled High-speed variable-length decoder; U.S. Pat. No. 5,241,490 entitled Fully decoded multistage leading zero detector and normalization apparatus; U.S. Pat. No. 5,237,667 entitled Digital signal processor system having host processor for writing instructions into internal processor memory; U.S. Pat. No. 5,223,832 entitled Serial data transmission circuit; U.S. Pat. No. 5,222,241 entitled Digital signal processor having duplex working registers for switching to standby state during interrupt processing; U.S. Pat. No. 5,220,670 entitled Microprocessor having ability to carry out logical operation on internal bus; U.S. Pat. No. 5,206,940 entitled Address control and generating system for digital signal-processor; U.S. Pat. No. 5,187,678 entitled Priority encoder and floating-point normalization system for IEEE 754 standard; U.S. Pat. No. 5,173,695 entitled High-speed flexible variable-length-code decoder; U.S. Pat. No. 5,161,117 entitled Floating point conversion device and method; U.S. Pat. No. 5,155,698 entitled Barrel shifter circuit having rotation function; U.S. Pat. No. 5,146,220 entitled Data conversion method and apparatus for converting undefined length data to fixed length data; U.S. Pat. No. 5,144,573 entitled Barrel shifter with parity bit generator; U.S. Pat. No. 5,130,941 entitled Dynamic barrel shifter; U.S. Pat. No. 5,130,940 entitled Barrel shifter for data shifting; U.S. Pat. No. 5,081,700 entitled Apparatus for high speed image rotation; U.S. Pat. No. 5,060,242 entitled Non-destructive lossless image coder; U.S. Pat. No. 5,045,993 entitled Digital signal processor; U.S. Pat. No. 5,040,138 entitled Circuit for simultaneous arithmetic calculation and normalization estimation; U.S. Pat. No. 5,031,135 entitled Device for multi-precision and block arithmetic support in digital processors; U.S. Pat. No. 5,029,121 entitled Digital filter processing device; U.S. Pat. No. 5,027,306 entitled Decimation filter as for a sigma-delta analog-to-digital converter; U.S. Pat. No. 4,983,958 entitled Vector selectable coordinate-addressable DRAM array; U.S. Pat. No. 4,980,853 entitled Bit blitter with narrow shift register; U.S. Pat. No. 4,979,175 entitled State metric memory arrangement for a viterbi decoder; U.S. Pat. No. 4,979,139 entitled Arithmetic unit for exponential function; U.S. Pat. No. 4,973,956 entitled Crossbar switch with distributed memory; U.S. Pat. No. 4,962,511 entitled Barrel shifter; U.S. Pat. No. 4,962,500 entitled Data processor including testing structure for a barrel shifter; U.S. Pat. No. 4,958,311 entitled Composite finite impulse response digital filter; U.S. Pat. No. 4,943,941 entitled Floating point processor employing counter controlled shifting; U.S. Pat. No. 4,939,684 entitled Simplified processor for digital filter applications; U.S. Pat. No. 4,914,622 entitled Array-organized bit map with a barrel shifter; U.S. Pat. No. 4,905,178 entitled Fast shifter method and structure; U.S. Pat. No. 4,901,263 entitled Versatile data shifter with sticky bit generation capability; U.S. Pat. No. 4,899,302 entitled Arithmetic unit for inverse trigonometric function; U.S. Pat. No. 4,887,232 entitled Apparatus and method for performing a shift operation in a multiplier array circuit; U.S. Pat. No. 4,862,407 entitled Digital signal processing apparatus; U.S. Pat. No. 4,839,840 entitled Highly responsive barrel shifter; U.S. Pat. No. 4,839,839 entitled Barrel shifter including rotate operation; U.S. Pat. No. 4,831,571 entitled Barrel shifter for rotating data with or without carry; U.S. Pat. No. 4,829,460 entitled Barrel shifter; U.S. Pat. No. 4,827,441 entitled Barrel shifter; U.S. Pat. No. 4,817,047 entitled Processing circuit capable of raising throughput of accumulation; U.S. Pat. No. 4,811,268 entitled Processing circuit capable of raising throughput of accumulation; U.S. Pat. No. 4,807,043 entitled Two-dimensional facsimile encoding apparatus with coding and reference line windowing means and color change detectors; U.S. Pat. No. 4,782,457 entitled Barrel shifter using bit reversers and having automatic normalization; U.S. Pat. No. 4,779,223 entitled Display apparatus having an image memory controller utilizing a barrel shifter and a mask controller preparing data to be written into an image memory; U.S. Pat. No. 4,779,220 entitled Floating-point data rounding and normalizing circuit; U.S. Pat. No. 4,760,544 entitled Arithmetic logic and shift device; U.S. Pat. No. 4,755,810 entitled Frame buffer memory; U.S. Pat. No. 4,747,154 entitled Image data expanding and/or contracting method and apparatus; U.S. Pat. No. 4,740,993 entitled Digital companding circuit; U.S. Pat. No. 4,665,538 entitled Bidirectional barrel shift circuit; U.S. Pat. No. 4,653,019 entitled High speed barrel shifter; U.S. Pat. No. 4,512,018 entitled Shifter circuit; and U.S. Pat. No. 4,488,252 entitled Floating point addition architecture.

In the past, three common approaches to variable bit encoding were used. The earlier of these methods, serial input to serial output, is useful at low communication rates as were common until a few years ago. A hybrid, serial input to parallel output, suffers disadvantages outlined below. The latter, parallel input to parallel output, is useful at higher bit rates and is advantageous over the earlier approach.

Devices incorporating the earlier, and more common, approach provide a serial stream of bits at an output thereof. Data is provided to the encoder device. The data is encoded according to an encoding algorithm and the encoded data is provided to a shift register. The shift register acts as a 1 bit wide FIFO (first in first out memory) and all the bits are shifted toward the output. Each clock cycle, a bit is extracted from the shift register and all the bits are again shifted. New bits provided to the shift register are shifted down until they are adjacent to any previously provided bits that are awaiting extraction.

It is evident that such a device is very suitable for low speed operation. At speeds of kilobits per second, or even several megabits per second, circuit speeds for current semiconductor technology, integrated circuit costs, and noise considerations are easily balanced to provide working circuitry.

In known serial input to parallel output shift registers, a serial bit stream is clocked through a series of serial registers and latched into parallel outputs. The number of parallel bits on the output is dependent on the number of bits shifted serially through the registers before a parallel latch is enabled.

Such a device has certain known shortcomings, for example, in a bit stuffing multiplexer circuit. A bit stuffing multiplexer inputs a signal at one frequency and stuffs (adds) bits into that signal, thus outputting a signal at a higher frequency. Such are useful in multiplexing schemes for interleaving signals of different rates. See, for example, American National Standards for Telecommunications, Digital Hierarchy-Optical Interface Rates and Formats Specification, ANSI T1.105-1988. The multiplexer circuit consists of a buffer, buffer write controller and a buffer read controller. The serial input to parallel output shift register will be located in the write controller and will generate the bit stuffing pattern by outputting gaps in the input signal where stuff data will be located. The read controller will generate the output signal framing pattern by placing additional gaps in the input signal.

The shortcomings of the above mentioned device in the bit stuffing multiplexer example are that (1) the location of the start of the bit stuffing pattern determined by the write controller cannot easily be fixed relative to the framing pattern, and (2) a control signal(s) from the write controller to the read controller must be passed through the buffer. The bit stuffing pattern is generated using a clock on the input side of the buffer, a clock that is asynchronous to the output clock. Therefore, when the circuit is initialized, the bit stuffing pattern will start at random locations relative to the framing pattern if control signals were passed through an additional buffer, but padding control signals through a buffer creates other shortcomings. If the circuit writing the control signals into the buffer fails when a control signal is in the buffer then read control circuit data corruption or framing pattern corruption may result.

With the advent of ATM and higher Ethernet speeds, communications systems now operate at speeds up to several Gigabits per second. At these speeds integrated circuit speed and noise pose significant constraints on shift register implementations. Solutions, when possible, require very costly materials or processes to accomplish a shift register implementation of a high speed communications encoding device.

In U.S. Pat. No. 5,272,703 entitled "N-Bit Parallel Input to Variable-Bit Parallel Output Shift Register" in the name of Peters, a parallel input to parallel output shift register is disclosed in an attempt to overcome the limitations of earlier serial to parallel encoding devices. The circuit disclosed recirculates data bits which are not output during the cycle to the shift register for output during a subsequent cycle.

This allows for bit stuffing where the output bit rate is lower than the rate at which bits accumulate within the shift register.

A known disadvantage of the circuit described by Peters is that the shift register implementation is complex and requires high speed integrated circuits for the recirculation circuitry where bits must be recirculated within a single clock cycle; during a single clock cycle, the data is provided to a multiplexer, stabilises at the multiplexer input and at the multiplexer output, stabilises at the shift register input, is clocked into the shift register, and stabilises at the shift register output. When using programmable logic such as that available from Xilinx® a nominal delay of 10 ns results. For eight bit parallel data, a maximum speed of about 800 Megabits per second results.

It would be advantageous to provide a simpler circuit that is capable of operating at higher speeds implemented using similar integrated circuit technologies.

OBJECTS OF THE INVENTION

In an attempt to overcome these and other shortcomings of the prior art, it is an object of the invention to provide a parallel input to variable-bit parallel output shift register that does not recirculate unused data bits.

SUMMARY OF THE INVENTION

A parallel input to variable-bit parallel output bit stuffing apparatus uses a barrell shifter having two sources of input bits, and performs bit stuffing in a stream of data without recirculating unused bits.

In accordance with the invention there is provided a data segmentation circuit comprising:
  a barrel shifter for providing a plurality of contiguous bits within the window as output bits, the barrel shifter having a window with a variable start location;
  bit stuffing means for receiving the output bits and for providing a predetermined number of bits for transmission, the predetermined number of bits comprising a first number of the output bits and a second number of other bits, the first number being one of a set of different amounts from 0 to the predetermined number, the second number being from 0 to the predetermined number, and the second number substantially equal to the predetermined number minus the first number; and,
  means for detecting a count indicative of the first number and for providing an increment signal to the barrel shifter in dependence thereon,
  wherein the barrel shifter shifts the variable start location of the window by an amount in response to the increment signal.

In an embodiment the data segmentation circuit comprises:
  a data buffer for receiving data segments each data segment comprising a plurality of bits and for storing received data segments in buffer locations;
  means for providing contiguous bits within the window from the data buffer as output bits, wherein the window is provided with a variable start location within the buffer and wherein the least significant bit of a data segment is contiguous the most significant bit of another data segment; and,
  means for moving the start location by one of a set of different amounts in response to the increment signal after provision of output bits.

According to another embodiment of the invention there is provided a variable bit length encoder for processing of input data, comprising:
  input means for receiving the input data and for providing a window that includes a sequence of bits which include at least sufficient bits for transmission during a current cycle;
  control means for generating a control signal and controlling the operation of said variable bit length encoder according to an encoding protocol;
  encoding means for receiving the control signal and the sequence of bits, for determining a second number of bits to stuff in dependence upon the control signal, for inserting the second number of bits and a first number of the sequence of bits received from said input means, and for generating an increment signal representative of the first number, the first number equal to a predetermined number minus the second number; and,
  computation loop means for receiving the increment signal and, in response thereto, shifting said encoding window to provide a new sequence of bits.

According to another aspect of the invention there is provided a method of data segmentation for DS3 to STS-1 mapping using a recirculating barrel shifter. The method comprises the steps of:
  providing data to the recirculating barrel shifter from an elastic store;
  selecting a predetermined number of contiguous bits from data provided to the recirculating barrel shifter as output bits, the output bits beginning at a start location;
  providing control signals including a synchronous payload envelope control signal and a throttle control signal;
  determining a number of overhead bits for insertion based on the control signals;
  filling a current location of the synchronous payload envelope with a predetermined number of bits including the number of overhead bits determined and a number of the output bits; and
  incrementing the start location by the number of output bits in the current location of the synchronous payload envelope.

BRIEF DESCRIPTION OF THE DRAWINGS

An exemplary embodiment of the invention will now be described in conjunction with the attached drawings, in which:

FIG. 3a is a table indicating signal names and descriptions to facilitate comprehension of the circuit diagram of FIG. 3;

FIG. 3b is a table showing the distribution of stuff opportunities in a synchronous payload envelope (SPE);

FIG. 5a is a table showing an example of output bits from the barrel shifter of FIG. 5;

FIG. 5b is a simplified data diagram and a simplified timing diagram for the input bits of FIG. 5a;

FIG. 11 is a truth table for the control signals and output bits of the STS-1 assembly sub-block in each of DS3 mode and data mode.

DETAILED DESCRIPTION OF THE INVENTION

Figure 1:
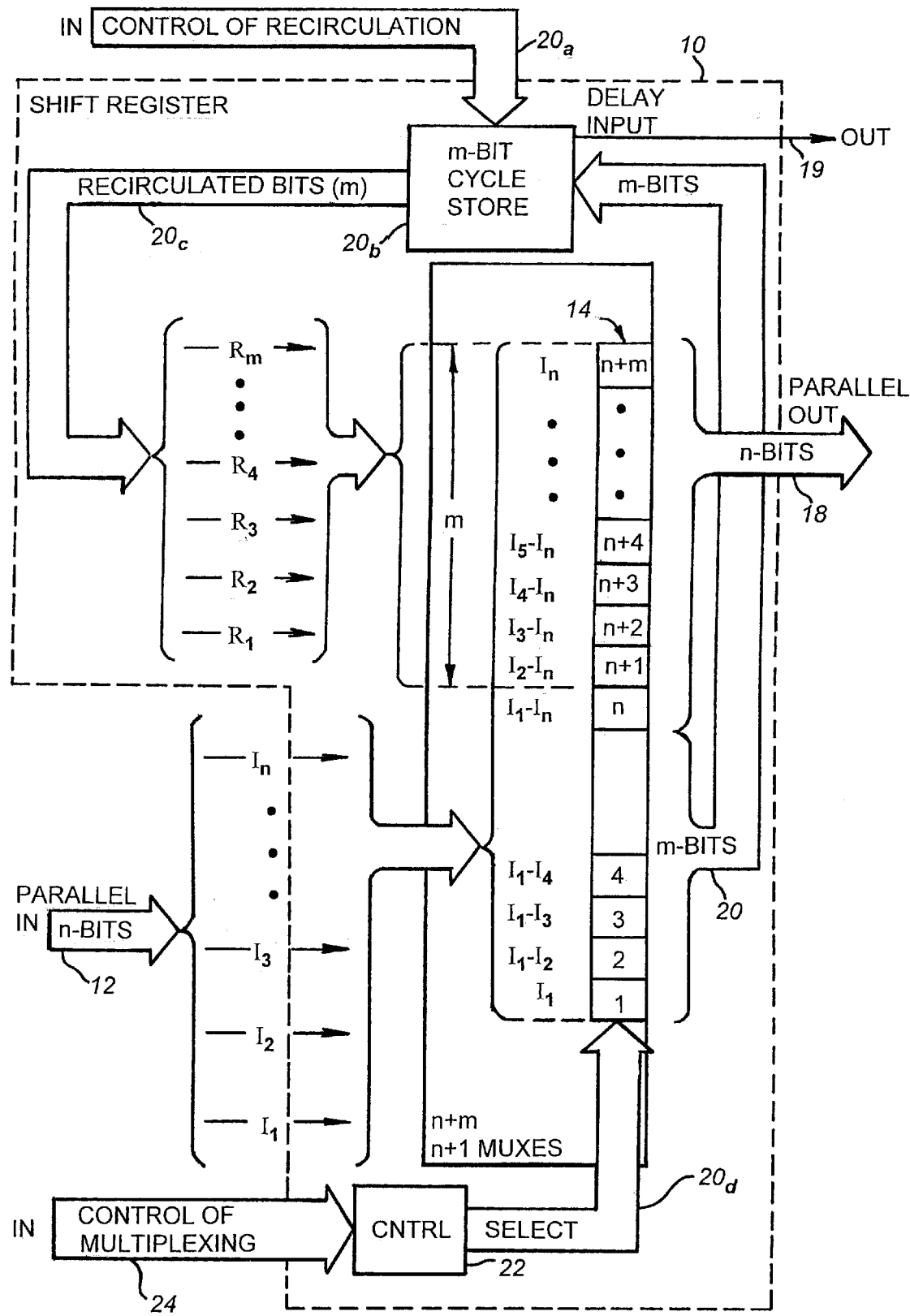
FIG. 1 is a simplified block diagram of a prior art n bit parallel input to variable-bit parallel output shift register that recirculates unused data bits according to the prior art.

Referring to FIG. 1 an n bit parallel input to variable bit parallel output shift register 10 according to the prior art is shown. The circuit is used, for example, in a read controller of a bit stuffing multiplexer which has a write controller used as a simple address counter and a buffer responsive to incoming data for providing same as n-bit parallel input data ($I_1 \ldots I_n$) on a bus 12 to the register 10.

Figure 2:
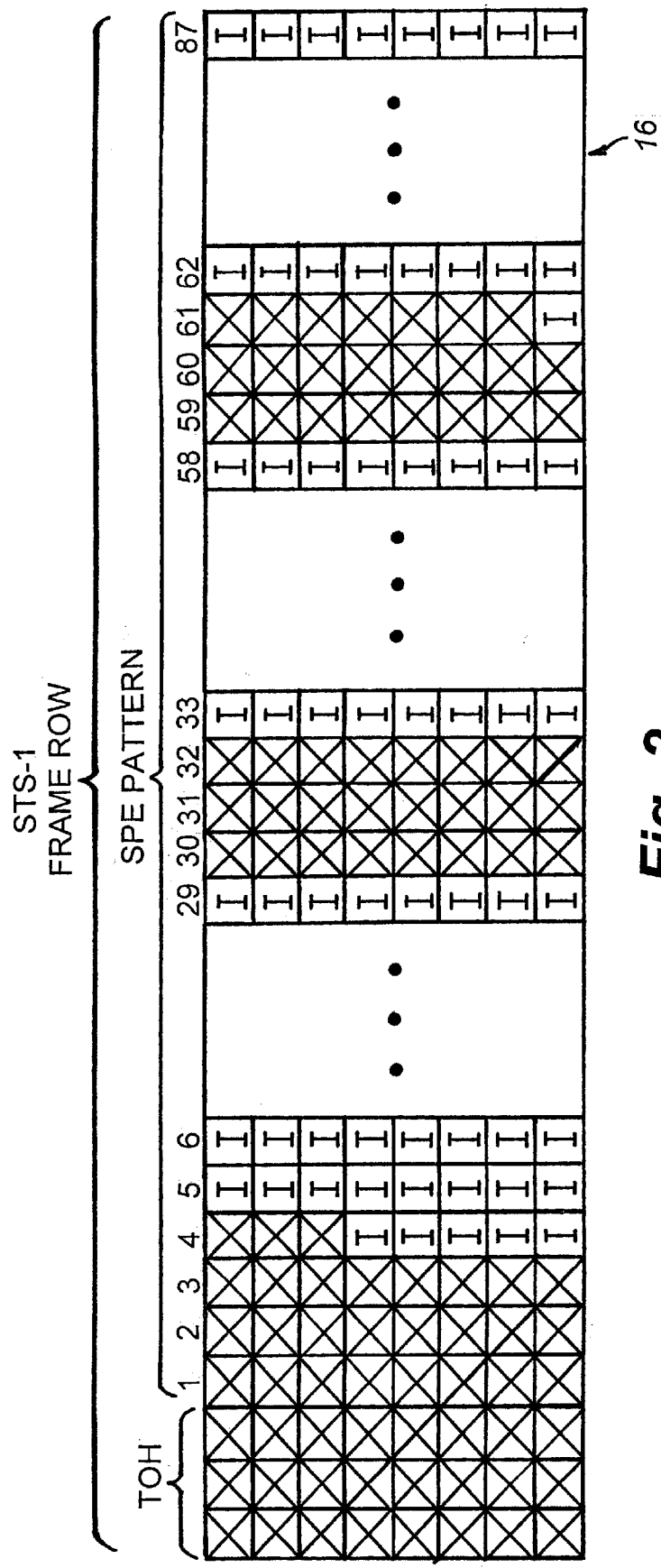
FIG. 2 is a diagram of a payload envelope as is known in the art.

The incoming data on the bus 12 is wholly data (I) bits absent stuff bits. For example, the data bus 12 provides eight bit parallel data as represented in FIG. 2 in a level one, synchronous transport signal (STS-1) synchronous payload envelope (SPE) 16. The illustrated envelope has a plurality, e.g., eighty-seven bytes which can consist of both I bits and stuff bits which are shown as "don't cares"(X) for simplicity. Of course, other types of bits and bytes such as path overhead bytes, stuff control bits, stuff opportunity bits, overhead communications channel bytes, fixed stuff bits, etc., may be employed as well. Most of the bytes indicated comprise only I bits but some comprise only X bits with two being a combination of I and X bits, i.e., bytes numbered four (4) and sixty-one (61).

The function of the shift register of FIG. 1 is to provide, in response to an orderly sequence of wholly data input bytes provided on the bus 12, a similarly timed but differently organized sequence of output bytes (1–90) on a bus 18, from left to right, such as shown in FIG. 2. It provides the wholly X bytes (TOH, 1–3, 30–32, 59 and 60), by providing a delay signal on a line 19 to the read controller for delaying for one cycle the input of the next I byte and during the same clock cycle as the delay occurs, provides X's on line 19 instead. For selected bytes (byte 4 and, when a recirculation control signal on a line 20a is active, byte 61) as many of the more significant I bits are output as possible—5 bits for column 4 and possibly 1 bit for column 61. The number of bits is dependent on the size of the n-bit output bus 18. the remaining I bits of lesser significance are recirculated on a bus 20 for output on the next cycle as the more significant bits of signal bus 18. Thus, the I bits are located in the LSB locations of the bytes in SPE columns 4 and 61, but the circuit 10 outputs these bits on the MSBs of bus 18. A different circuit (not shown) may be used to shift them to their original locations. The circuit 10 does the same in bytes after bytes 4 and 61, with recirculated I bits of lesser significance. Thus, the incoming I bits are always output on n adjacent multiplexers but, in some cycles, only some of them may be output on bus 18 in the same cycle in which it is input. If the shift register is too full of bits due to bit stuffing to allow the input of additional I bits, the input can be delayed a cycle or more by providing the signal on line 19 to empty the register or to at least allow the less significant bits to be recirculated to make room for a newly incoming I byte.

In response to the recirculation control signal on the line 20a, an m-bit cycle store 20b stores the recirculated m bits from the m least significant bits of the n+m multiplexers and inputs the stored bits on a line 20c to the inputs of the m most significant bits of the multiplexers on the next available cycle.

In the context of the example, the plurality (e.g., (n+m)= 15, where n=8 and m=7) of 8:1 multiplexers are connected in parallel. The bits ($I_1$–$I_8$) of input bus 12 are connected to the fifteen 8:1 multiplexers in such a way that bits $I_1$ through $I_8$ of the input byte may be provided on the outputs of any selected group of eight adjacent multiplexers (eight possibilities).

If a select line 20d selects "zero", meaning no down shift, the input bits $I_1$ to $I_8$ are output by multiplexers 8 to 15 and thus with no downward shift of the output pattern of the contiguous input I bits, i.e., no transition of any of the less significant, currently input I bits to a subsequently output byte, and no stuff bits. On the other hand, if the select line 20d selects a shift down number one through seven, the input bits will be shifted downward by the selected number of bits and thus will be output on eight adjacent multiplexers having a most significant bit from fourteen through eight, respectively. A control 22 provides the select signal on the line 20d in response to a control signal on a line 24.

It will be seen that, under this scheme, the currently input byte has its eight I bits output on eight contiguous multiplexers anywhere within the range of the fifteen multiplexer register. Only one ("zero" shift) of those eight choices, however, will result in all eight I bits being output altogether on the bus 18. All of the seven other choices result in some of the bits being recirculated for output later.

According to the invention an encoder accepts a continuous DS3 data stream in byte format and supplies data in 1-bit, 5-bit, or 8-bit segments as is required to fill a Synchronous Payload Envelope (SPE) of a SONET STS-1 signal. The data encoding and data rate variability are supported by a recirculating 16-input, 8-output barrel shifter. This circuit examines its 16 input bits representing 2 consecutive DS3 bytes and selects the required number of bits—1, 5, or 8. The required number of bits are transferred to the Least Significant Bit (LSB) positions of the barrel shifter output.

Figure 3:
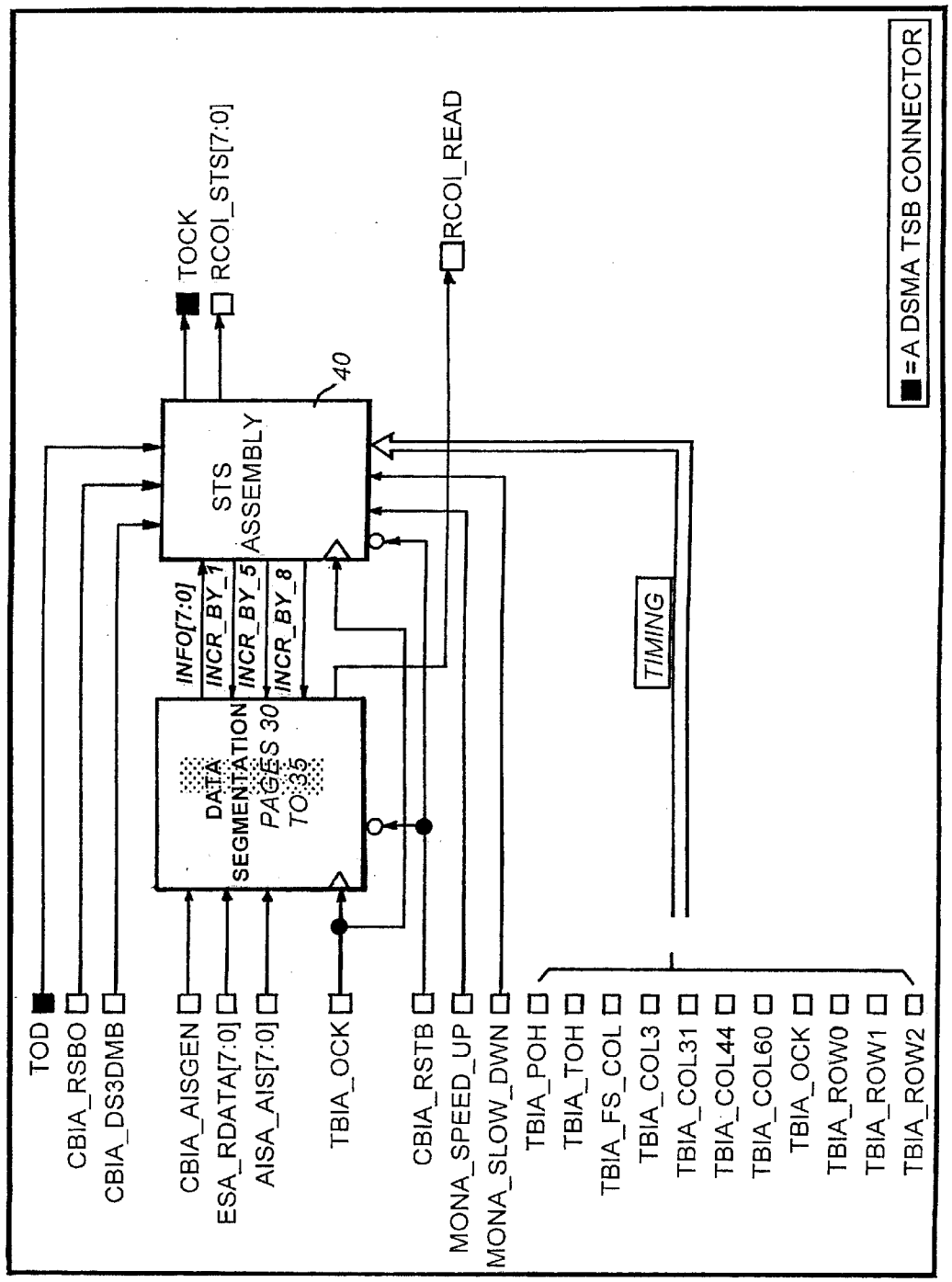
FIG. 3 is a simplified block diagram of Read Control and Overhead Insertion (RCOI) circuit according to the invention.

Referring now to FIG. 3, a Read Control and Overhead Insertion (RCOI) according to the invention is shown. The RCOI block, assembles a complete STS-1 signal except for transport and path overhead which is set to zero. In FIG. 3a, a table indicating signal names and descriptions is provided to facilitate comprehension of the circuit diagram.

In DS3 mode, data to fill the information bit and byte slots of the SPE come from either an elastic store or an alarm indication signal (AIS) generator if the latter is enabled. This data is multiplexed with a variety of overhead bits to create an SPE structure known in the art. An aspect of this process involves bit stuffing. As is known in the art, when bit stuffing is employed, a risk of overflow exists. The signals MONA_SLOW_DOWN and MONA_SPEED_UP act as throttle signals supplied from the elastic store monitor; based on these signals, the RCOI block inserts fewer or more data bits, respectively, into the available stuff opportunities.

In this mode the SPE structure is simpler. In essence, the circuit receives data comprising a predetermined number of bits. The data is encoded through bit stuffing to result in the SPE for a current mode of operation—DS3 mode or data mode. From the encoded or stuffed data, a variable number of bits—1, 5, or 8—are extracted during each clock cycle. In Data mode, data to fill the information slots of the SPE come from the elastic store.

Referring to FIG. 3b, a table showing the distribution of stuff opportunities in the SPE is shown. Each row is indicative of a different throttle speed—slow, nominal, or fast. The throttle speed is dependent upon MONA signals from the elastic store and nominal indicates that neither signal is set. A condition where both signals are set is precluded since slow down and speed up are mutually exclusive. Alternatively, one of the signals takes priority and when set the other signal is treated as a 'don't care.'

According to the invention, a recirculating barrel shifter is used for segmenting data in a memory buffer. The size of the memory buffer is determined in dependence upon circuit size, cost, and other design requirements. In the preferred embodiment described with reference to FIGS. 4 to 9, a 16 bit memory buffer is employed.

Figure 4:
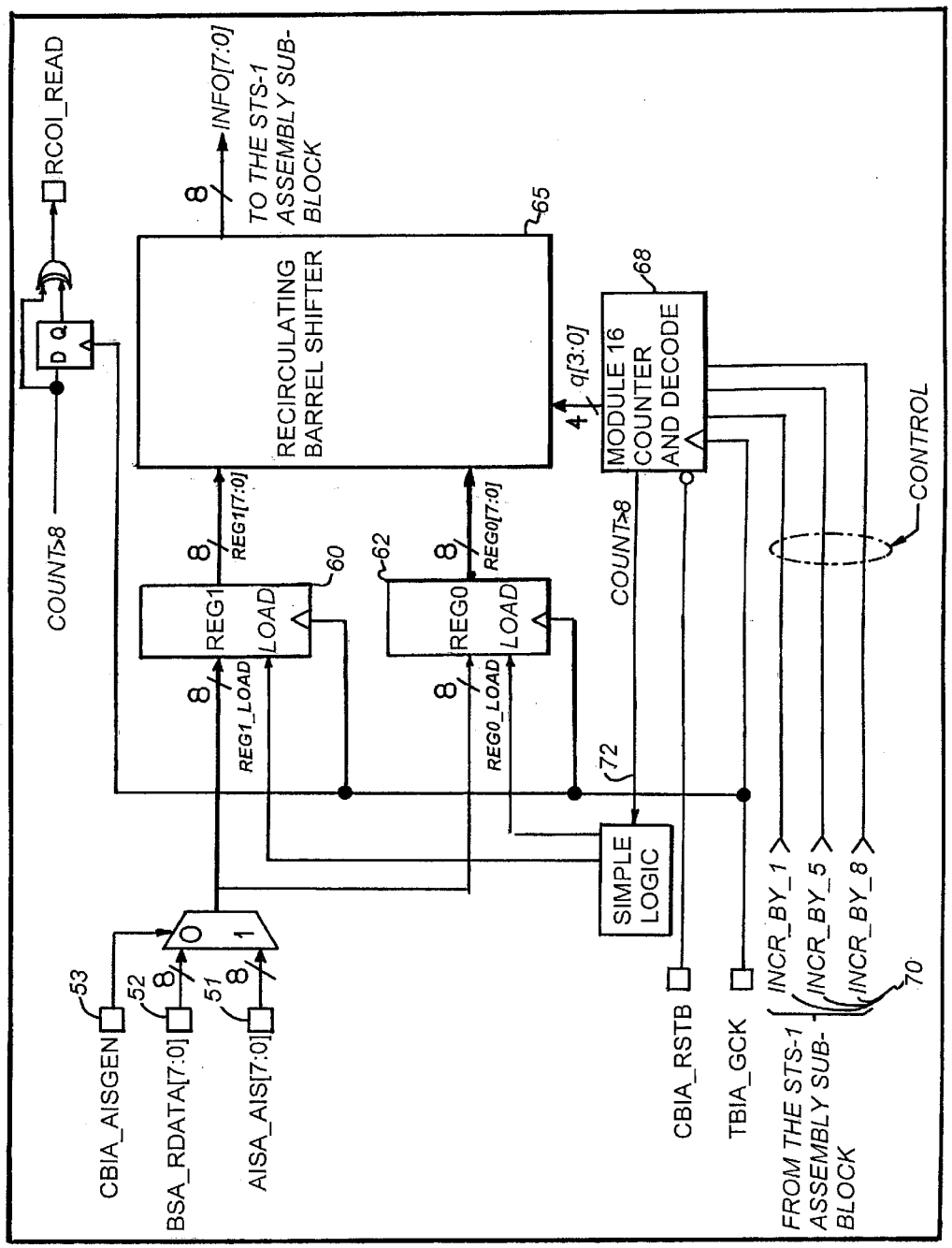
FIG. 4 is a simplified block diagram of a data segmentation circuit according to the invention.

Referring to FIG. 4, a data segmentation circuit is illustrated. The circuit accepts data bits in the form of bytes from either the AIS generator 51 or the elastic store 52. The data source is selected based on a signal provided on line CBIA_AISGEN 53. This data is loaded, alternately, into REG1 60 or REG0 62. Together, the outputs of REG1 60 and REG0 62 constitute a 16-bit input of a recirculating barrel shifter 65. A recirculating barrel shifter allows for shifting of bits in a wrap around fashion so the lowest order bit is adjacent the highest order bit. The barrel shifter 65 selects a segment comprising a 1-bit, 5-bit, or 8-bit data segment from its input and provides this data segment in the least significant bit (LSB) positions of its output.

The shift amount of the barrel shifter ranges from 0 to 16 and is controlled by a modulo-16 counter 68. This counter is incremented in steps of varying size, and is allowed to simply roll over, maintaining alignment with the recirculating barrel shifter 65. The step size during any cycle is directly related to the current location in the SPE as defined by control signals 70 provided by the STS Assembly sub-block 40. A current location in the DS3 SPE will require either:

a) 0 information bits, implying a counter increment of 0;
b) 1 information bit for the stuff opportunity, if utilized, in column 60, implying a counter increment of 1;
c) 5 information bits during column 3, implying a counter increment of 5; or
d) 8 information bits during columns 4 to 28, 32 to 57, and 61 to 86, implying a counter increment of 8.

In Data mode the current location in the SPE always results in 8 information bits, implying a counter increment of 8, thus the barrel shifter 65 supplies a number of information bits (0, 1, 5, or 8) as required by the STS-1 Assembly Sub-block 40. In fact, this is easily accomplished by supplying a same 8 information bits to the STS-1 Assembly Sub-block 40 during each cycle and varying the increment of the counter based on a number of information bits included within the current location in the SPE.

In order to determine when it is time to load a new byte into either REG0 or REG1, a "count>8" signal 72 is decoded from the modulo-16 counter 68—a decimal count of 9, 10, 11, 12, 13, 14 or 15. A change in this signal means that 8 bits have been handed off to the STS-1 Assembly Sub-block and a new byte must be loaded. When the count rises above 7, REG0 is loaded and when the count rolls over, REG1 is loaded.

The modulo-16 counter does not need to be initially reset in order for the barrel shifter to work properly. It can start up anywhere, since it is the relative movement of the counter which is important, not the absolute state. Of course, some synchronisation is commonly performed at start up of a communication system in the form of an STS-1 and DS3 conversion system. And the relative movement of the counter is governed by timing strobes which are ultimately synchronized to the J1 byte in the SPE.

Figure 5:
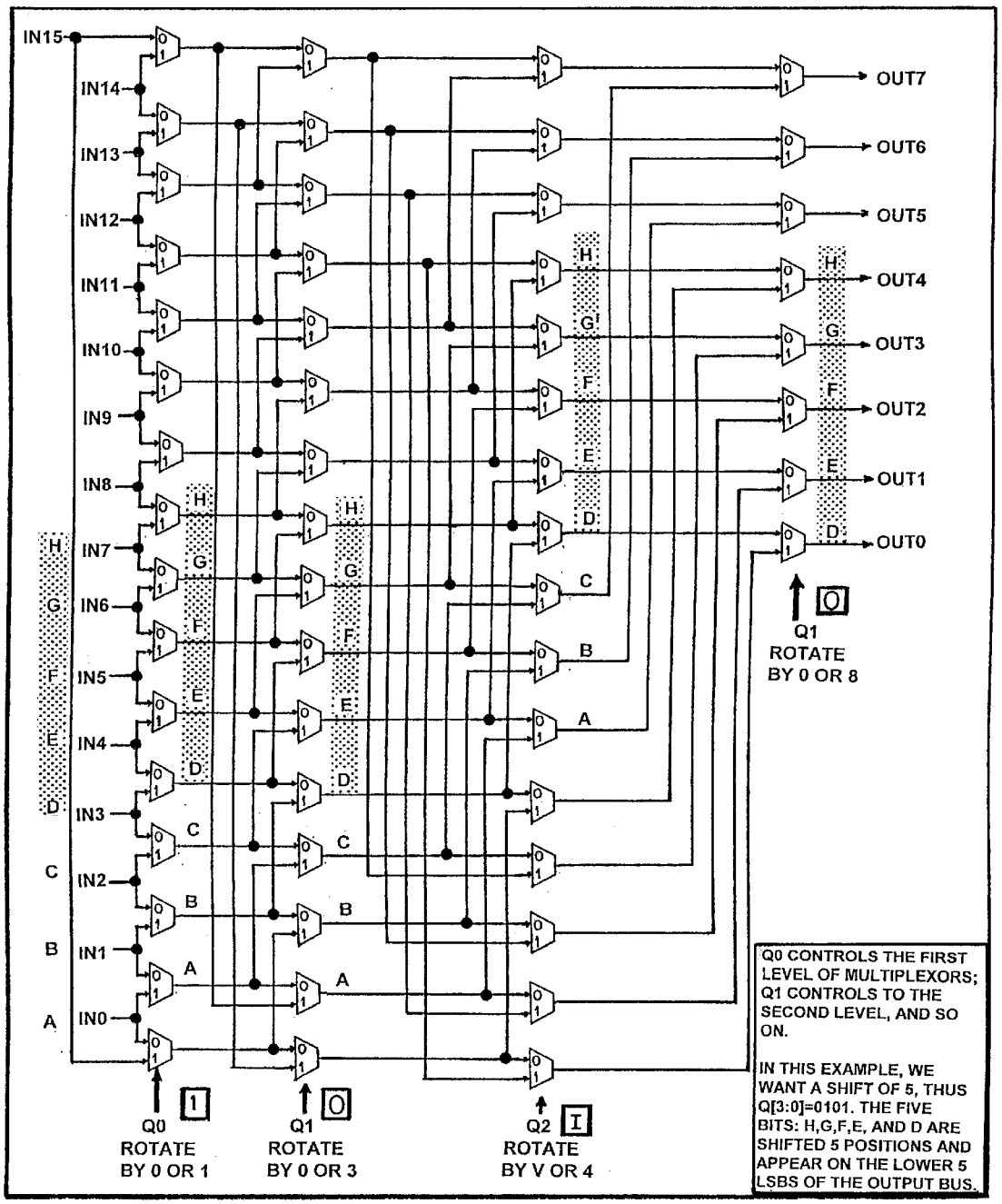
FIG. 5 is a simplified schematic diagram of a barrel shifter circuit implemented using three stages of multiplexers.

The barrel shifter is of a recirculating design. An example, built from 2-input multiplexers, is shown in FIG. 5. The circuit allows any 8-bit segment of the 16-bit input to the barrel shifter 65 to be provided to the output thereof. The 4-bit counter allows selection of an amount of the shift using simple binary arithmetic. A highest order bit selects shift by 8 bits or by 0 bits, another selects shift by 4 bits or 0 bits, another by 2 bits or 0 bits and a least significant bit selects shift by 1 bit or 0 bits. Since the data segment is contiguous with the exception of circulating the highest order bit and the lowest order bit to form a loop, the 0 through 15 shift positions allow selection of any 8-bit data segment as output bits.

The bits provided to the output are provided to the STS-1 assembly sub-block where only those bits required are included in the current location of the SPE. The other bits are ignored. It is therefore, essential that the counter increment by an amount equal to the number of bits used by the STS-1 assembly sub-block for a present location. Therefore the counter, as described above, is provided with that functionality.

An example of output bits from the barrel shifter of FIG. 5 is shown in the table of FIG. 5a. Eight bits are provided by the barrel shifter during each clock cycle, but only some of those bits are used in the current SPE location. Fourteen clock cycles are shown and each clock cycle is numbered. During clock cycle number 1 only five bits are used in the SPE. During clock cycles 2–4, eight bits are used in the SPE. During clock cycle number 5, only one bit is used in the SPE. For each of the five clock cycles discussed a location within the SPE is provided having a same number of bits including a number of information bits and a number of stuffed bits. For clock cycles 2–4, the number of stuffed bits is zero. For clock cycle 1, the number of stuffed bits is three. For clock cycle number 5, the number of stuffed bits is seven.

Referring to FIG. 5b, a data and simplified timing diagram is shown for providing the output bits of FIG. 5a. Eight bits are provided to the buffer and all eight are provided as output bits from the barrel shifter to the STS-1 assembly block. As is shown in FIG. 5a and through shading in FIG. 5b, only five of the bits are used in the SPE during the clock cycle; the counter is incremented by 5. The next eight bits—three that remain and then five more from the top of the buffer— are provided to the STS-1 assembly block. The eight bits are all used in the SPE during the clock cycle and the counter is incremented by 8. Analysis of FIG. 5b, establishes that new data always ends at a byte boundary and that upon crossing the byte boundary into the "newest" byte of data within the buffer, another byte is loaded into the buffer. Because more than eight bits are not used within the SPE during a clock cycle, the buffer always has sufficient data to provide to the STS-1 assembly block so long as the elastic buffer is not empty.

Figure 6:
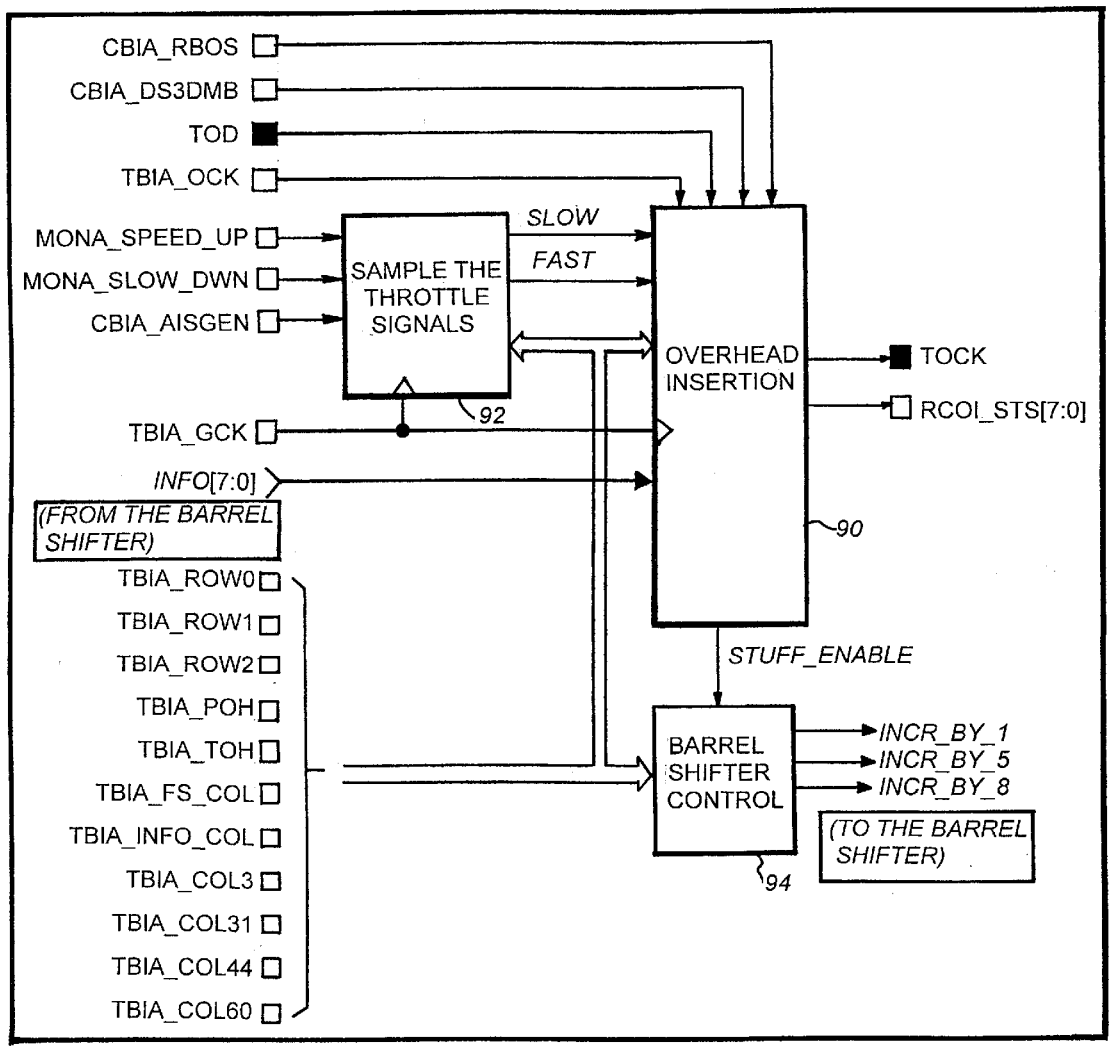
FIG. 6 is a simplified block diagram of the STS-1 assembly sub-block.

The STS-1 assembly block is shown in more detail in FIG. 6. The output bits, info[7:0], from the barrel shifter 65 are provided to an overhead insertion circuit 90. The overhead insertion circuit 90 receives a plurality of control signals relating to the SPE. For example, control signals indicating a location within the SPE are received. The overhead insertion circuit 90 also receives throttle control signals sampled by a sampling circuit 92. The sampling circuit 92 is clocked by a same clock signal as the overhead insertion circuit 90 in order to maintain synchronisation. From the overhead insertion circuit 90 are provided a plurality of output signals. RCOL_STS[7:0] is the STS output byte. Since the signal RCOL_STS is comprised of a number of data bits as well as overhead bits, the overhead insertion circuit 90 determines, in dependence upon received control signals, a number of data bits to place in RCOL_STS during a particular clock cycle. This determination is provided to a barrel shifter control circuit 94. Alternatively, the barrel shifter control circuit 94 receives control signals for determining the overhead insertion circuit operations during the current clock cycle. The barrel shifter control circuit 94 provides a signal indicative of an increment amount for the counter.

Incrementing the counter by 0, 1, 5, or 8 is accomplished in any of a number of ways. In an embodiment, the counter is provided with adder circuitry for establishing a next counter value. In another embodiment, the barrel shifter control circuit 94 increments the counter a number of times—0, 1, 5, or 8—during a single clock cycle of the segmentation circuit. Of course, other implementations of incrementing the counter by are also applicable to the present invention.

Figure 7:
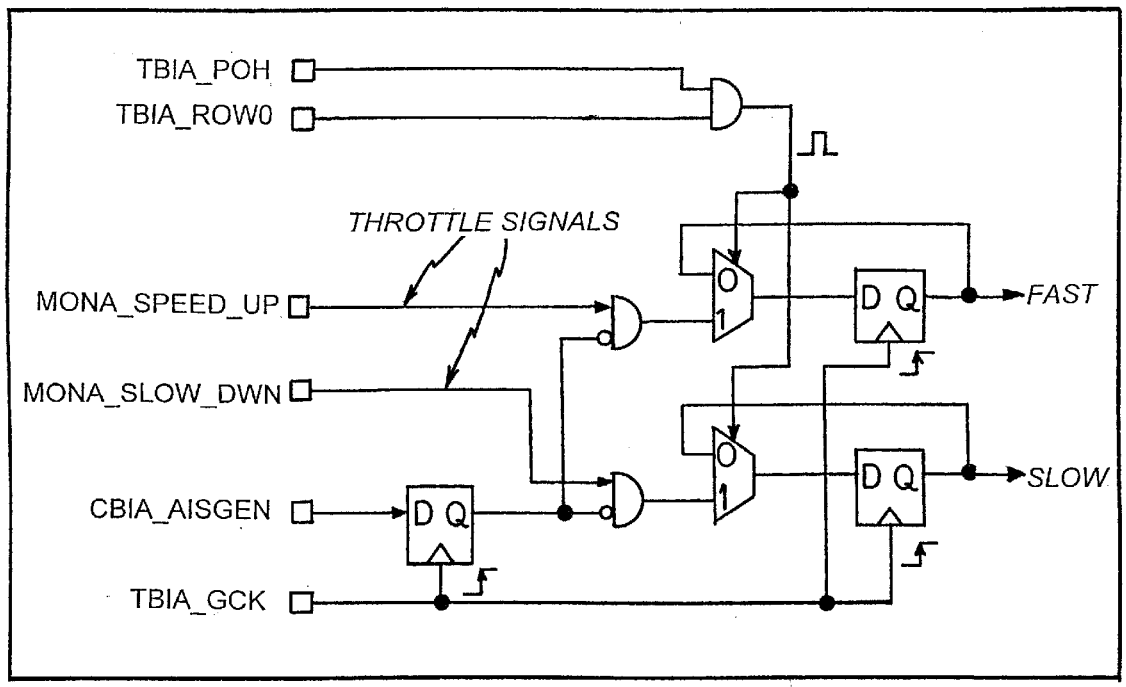
FIG. 7 is a simplified diagram of the throttle circuit.

Referring to FIG. 7, the throttle circuit 92 is shown in more detail. The throttle signals are gated by a signal dependent on an alarm indication signal. When an alarm indication is being transmitted, no throttling is required. When the alarm indication signal is not being transmitted, throttling is clocked into two flip flops which act to latch the throttle signals and, in effect, sample the throttle signals on a clock edge.

Figure 8:
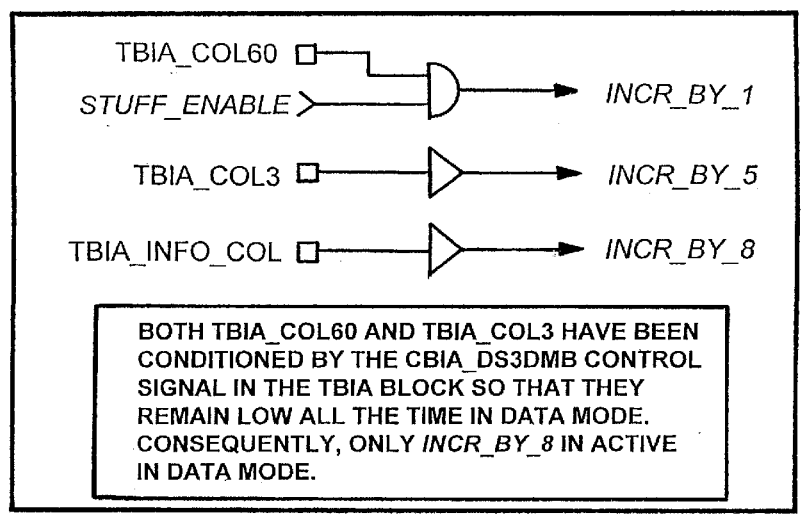
FIG. 8 is a detailed diagram of the barrel shifter control circuit.

Referring to FIG. 8, a detailed diagram of the barrel shifter control circuit is shown. The input signals are conditioned to be disabled during data mode so that increment by 8 remains active and the other signals are inactive. TBA_COL60 is gated to account for a zero bit column 60 as discussed above. As is shown, increment amounts are determined based on location in the SPE.

Figure 9:
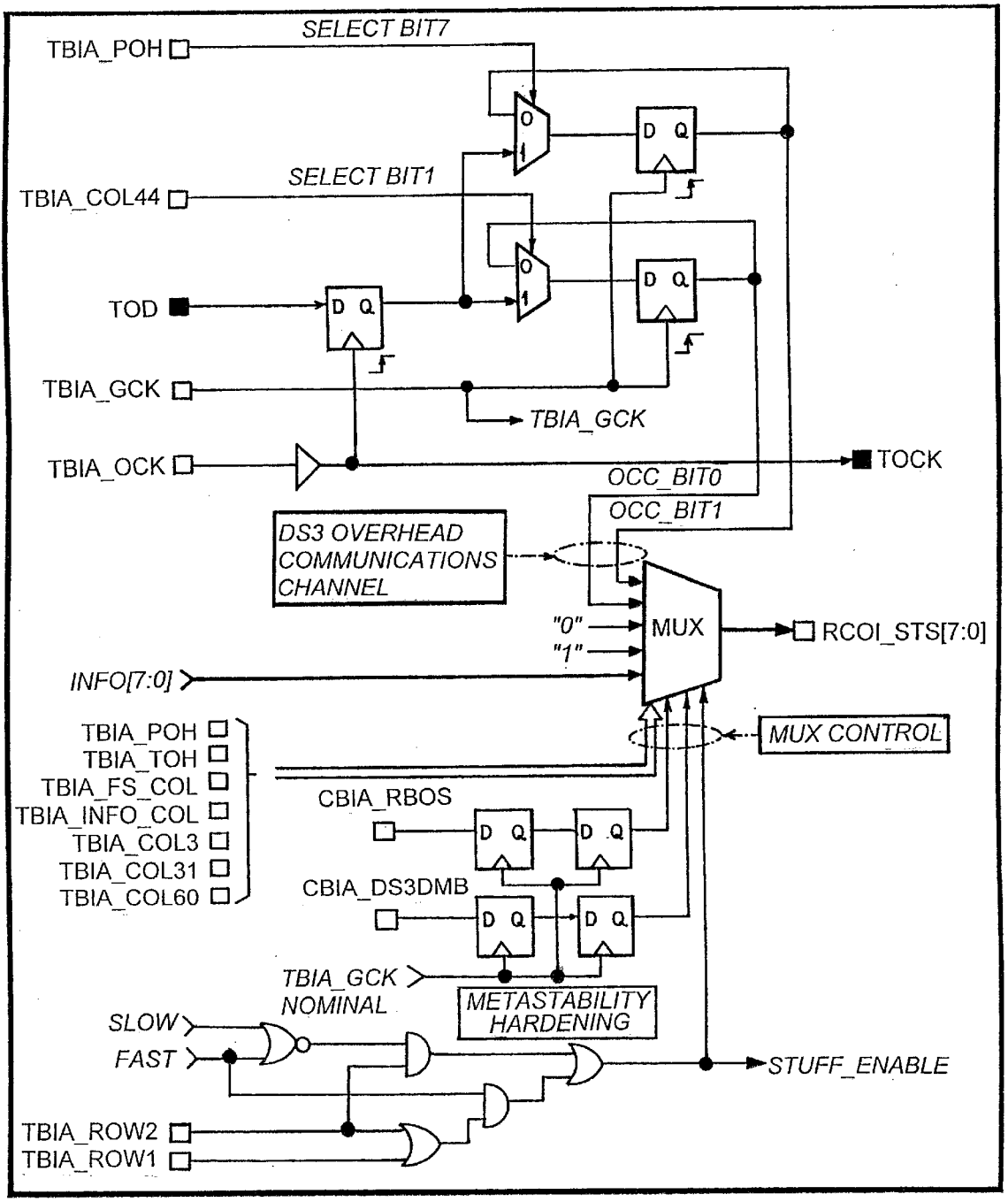
FIG. 9 is a detailed diagram of the overhead insertion circuit.
Figure 10:
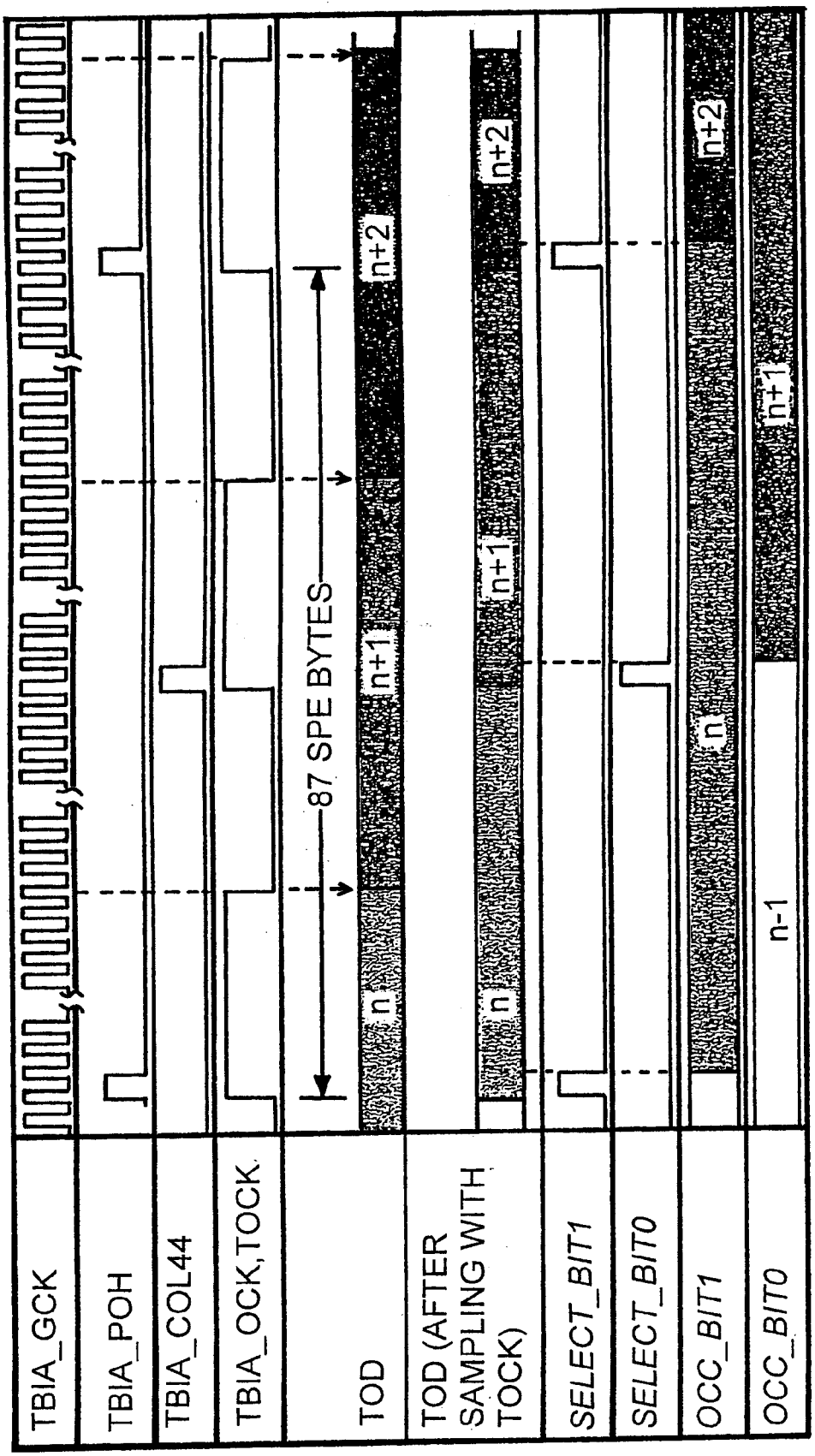
FIG. 10 is a timing diagram of a circuit according to the invention.

Referring to FIG. 9, a detailed diagram of the overhead insertion circuit 90 is shown. As is evident from the circuit diagram, info[7:0] are provided to the overhead insertion circuit in a fashion that allows easy insertion of overhead bits. The bits in the signal info[7:0] need not be rearranged in different fashions depending on a number of stuffed bits. This allows for a simple overhead insertion circuit as shown reducing complexity over prior art circuits.

An advantage of the present embodiment is that only two bytes of buffer memory are required to perform data segmentation. This reduces circuit size and cost and also reduces data latency because a maximum of two consecutive DS-3 bytes are maintained in the data store. A further advantage to the preferred embodiment is that no data is fed back to the buffer therefore reducing noise, circuit requirements, and cycle time. This allows for high speed operation of the circuit.

Numerous other embodiments can be envisioned without departing from the spirit or scope of the invention.

What is claimed is:

1. A data segmentation circuit comprising:
    a barrel shifter, having a window with a variable start location, for providing a plurality of contiguous bits within the window as output bits;
    bit stuffing means for receiving the output bits and for providing a predetermined number of bits for transmission, the predetermined number of bits comprising a first number of the output bits and a second number of other bits, the first number being one of a set of different amounts from 0 to the predetermined number, the second number being from 0 to the predetermined number, and the second number substantially equal to the predetermined number minus the first number; and,
    means for detecting a count indicative of the first number and for providing an increment signal to the barrel shifter in dependence thereon,
    wherein the barrel shifter shifts the variable start location of the window by an amount in response to the increment signal.

2. A data segmentation circuit as defined in claim 1 wherein the barrel shifter comprises:
    a data buffer for receiving data segments each data segment comprising a plurality of bits and for storing received data segments in buffer locations;
    means for providing contiguous bits within the window from the data buffer as output bits, wherein the window is provided with a variable start location within the buffer and wherein the least significant bit of a data segment is contiguous the most significant bit of another data segment; and,
    means for moving the start location by one of a set of different amounts in response to the increment signal after provision of output bits.

3. A data segmentation circuit as defined in claim 2 wherein the set of different amounts consists of fewer amounts than the predetermined number of amounts.

4. A data segmentation circuit as defined in claim 2 wherein the barrel shifter comprises:
    means for detecting when moving the start location results in a start location moving from a first data segment to a second different data segment within the data buffer and for providing a load signal in dependence thereon; and
    means, responsive to the load signal, for loading a predetermined number of bits into the buffer locations where the first data segment was stored.

5. A data segmentation circuit as defined in claim 4 wherein the data buffer comprises two 8-bit segments, wherein the means for selecting a start location comprises a 4-bit counter, and wherein the means for detecting when moving the start location results in a start location moving from a first data segment to a second different data segment within the data buffer and for providing a load signal in dependence thereon comprises a comparator for detecting changes to the most significant bit of the 4-bit counter.

6. A data segmentation circuit as defined in claim 5 for use in DS-3 to STS1 mapping.

7. A data segmentation circuit as defined in claim 2 wherein data segments comprise eight bits, wherein the output bits comprise 8 consecutive bits and wherein the counter is incremented by 0, 1, 5, or 8.

8. A data segmentation circuit as defined in claim 2 wherein the means for moving the start location comprises a 4-bit counter.

9. A data segmentation circuit as defined in claim 1 wherein the bit stuffing means provides overhead insertion for STS1.

10. A data segmentation circuit as defined in claim 1 comprising control means including throttle control means for varying one of input and output data rates.

11. A variable bit length encoder for processing of input data, comprising:

input means for receiving the input data and for providing a window that includes a sequence of bits which include at least sufficient bits for transmission during a current cycle;

control means for generating a control signal and controlling the operation of said variable bit length encoder according to an encoding protocol;

encoding means for receiving the control signal and the sequence of bits, for determining a second number of bits to stuff in dependence upon the control signal, for inserting the second number of bits and a first number of the sequence of bits received from said input means, and for generating an increment signal representative of the first number, the first number equal to a predetermined number minus the second number; and, computation loop means for receiving the increment signal and, in response thereto, shifting said encoding window to provide a new sequence of bits.

12. A variable bit length encoder for processing of input data as defined in claim 11 wherein the control means includes throttle control means.

13. A method of data segmentation for DS3 to STS-1 mapping using a recirculating barrel shifter and comprising the steps of:

providing data to the recirculating barrel shifter from an elastic store;

selecting a predetermined number of contiguous bits from data provided to the recirculating barrel shifter as output bits, the output bits beginning at a start location;

providing control signals including a synchronous payload envelope control signal and a throttle control signal;

determining a number of overhead bits for insertion based on the control signals;

filling a current location of the synchronous payload envelope with a predetermined number of bits including the number of overhead bits determined and a number of the output bits; and incrementing the start location by the number of output bits in the current location of the synchronous payload envelope.

14. A method of data segmentation for DS3 to STS-1 mapping as defined in claim 13 wherein a location consists of 8 bits.

* * * * *